US006982891B2

(12) United States Patent
Monzel, III

(10) Patent No.: US 6,982,891 B2
(45) Date of Patent: Jan. 3, 2006

(54) RE-CONFIGURABLE CONTENT ADDRESSABLE/DUAL PORT MEMORY

(75) Inventor: Carl Anthony Monzel, III, Lakeville, MN (US)

(73) Assignee: LSI Logic Corporation, Milpitas, CA (US)

( * ) Notice: Subject to any disclaimer, the term of this patent is extended or adjusted under 35 U.S.C. 154(b) by 107 days.

(21) Appl. No.: 10/458,409

(22) Filed: Jun. 10, 2003

(65) Prior Publication Data

US 2004/0252537 A1 Dec. 16, 2004

(51) Int. Cl.
*G11C 15/00* (2006.01)

(52) U.S. Cl. ................ 365/49; 365/189.08; 365/230.05

(58) Field of Classification Search .................. 365/49, 365/189.08, 230.05, 189.11, 189.07, 51, 63, 365/154, 156
See application file for complete search history.

(56) References Cited

U.S. PATENT DOCUMENTS

| | | | | | |
|---|---|---|---|---|---|
| 5,408,434 | A | * | 4/1995 | Stansfield | 365/189.08 |
| 5,706,224 | A | * | 1/1998 | Srinivasan et al. | 365/49 |
| 6,058,452 | A | * | 5/2000 | Rangasayee et al. | 711/108 |
| 6,597,594 | B2 | * | 7/2003 | Waller | 365/49 |
| 6,711,086 | B2 | * | 3/2004 | Terada | 365/230.05 |
| 6,747,903 | B1 | * | 6/2004 | Pan et al. | 365/189.01 |
| 6,778,462 | B1 | * | 8/2004 | Castagnetti et al. | 365/230.05 |
| 2003/0072171 | A1 | * | 4/2003 | Rhee et al. | 365/49 |

* cited by examiner

*Primary Examiner*—Michael S. Lebentritt
*Assistant Examiner*—Dang Nguyen
(74) *Attorney, Agent, or Firm*—Yee & Associates, P.C.

(57) ABSTRACT

A re-configurable core cell is provided that can be used as either a content addressable memory cell or a dual-ported static read only memory cell. The re-configurable core cells are pre-diffused on the chip. The core cells may then be configured as CAM or SRAM with a metal layer. The peripheral logic of the CAM or SRAM may be built from gate array devices.

18 Claims, 7 Drawing Sheets

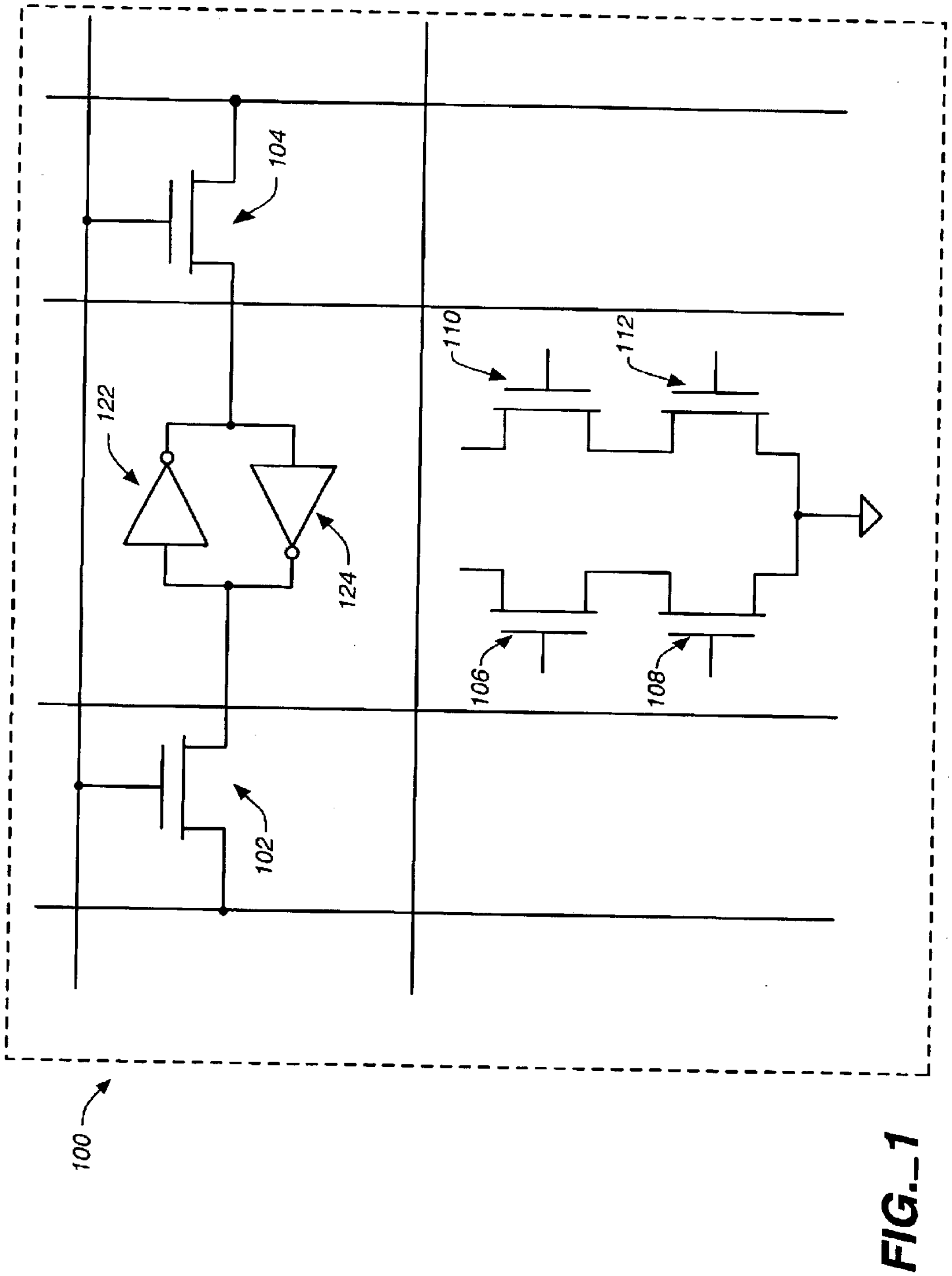
FIG._1

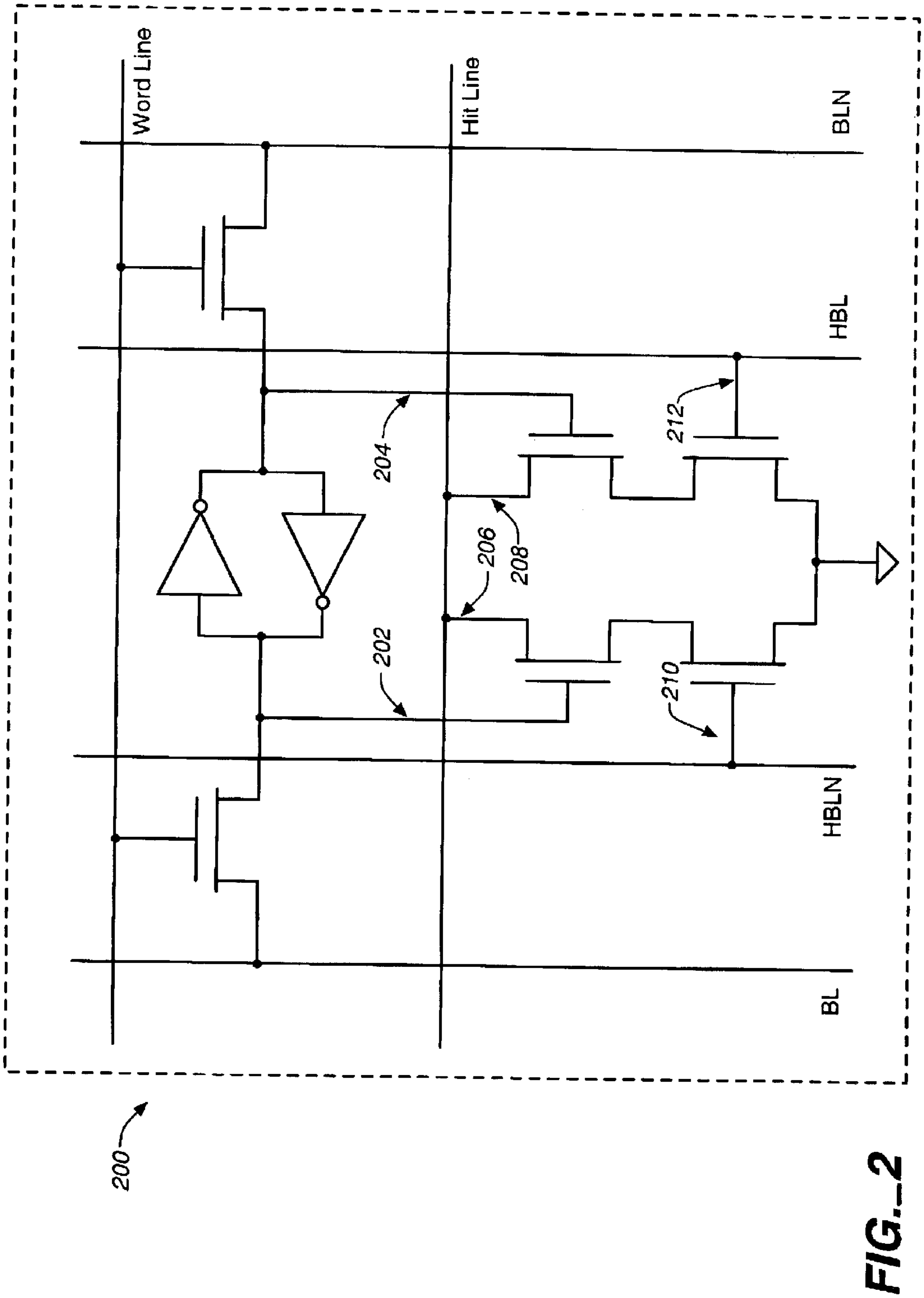
FIG._2

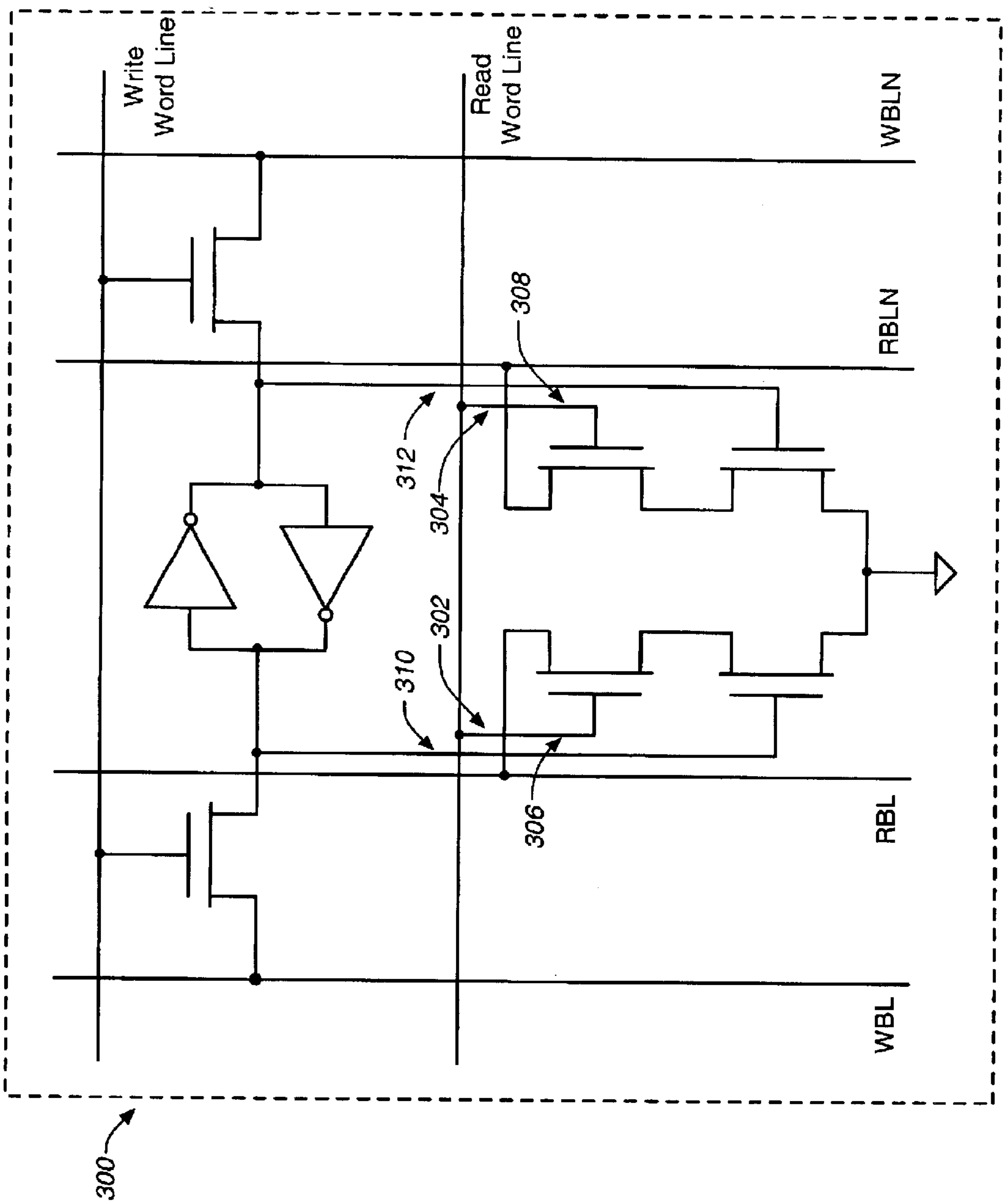
FIG._3

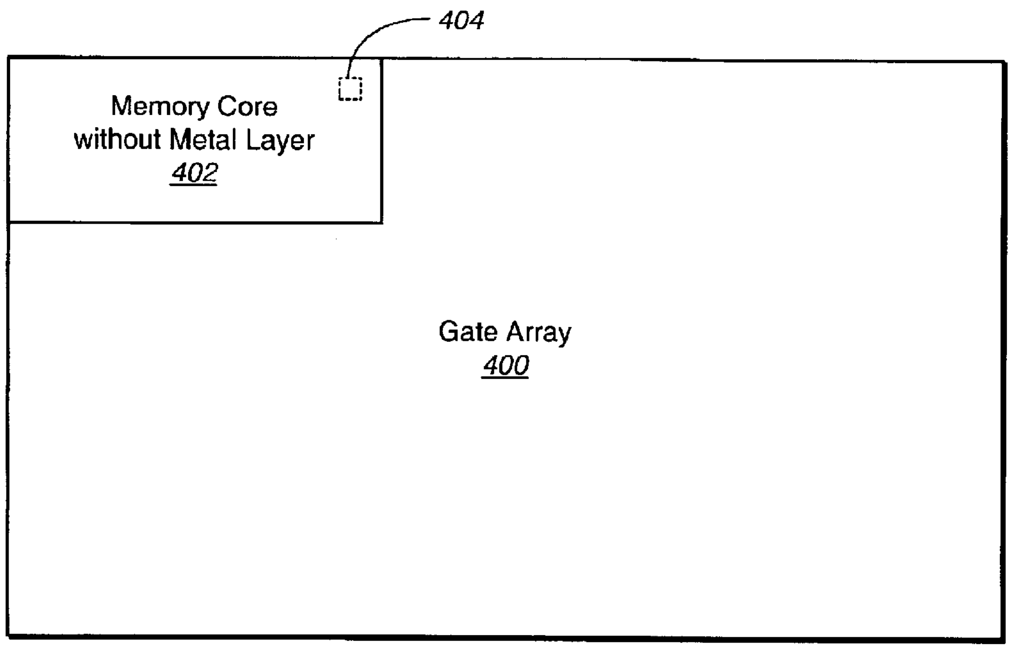
FIG._ 4A
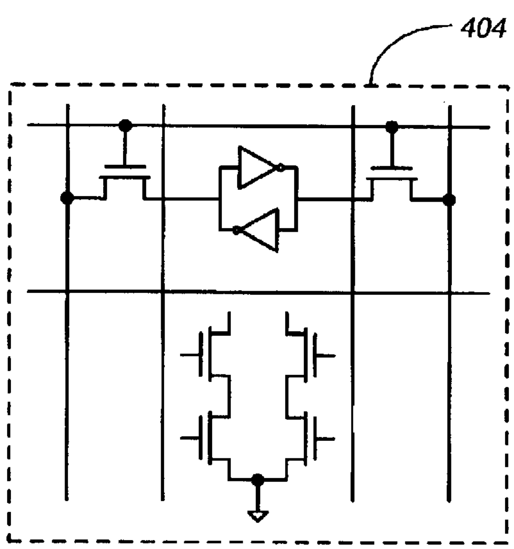
FIG._ 4B

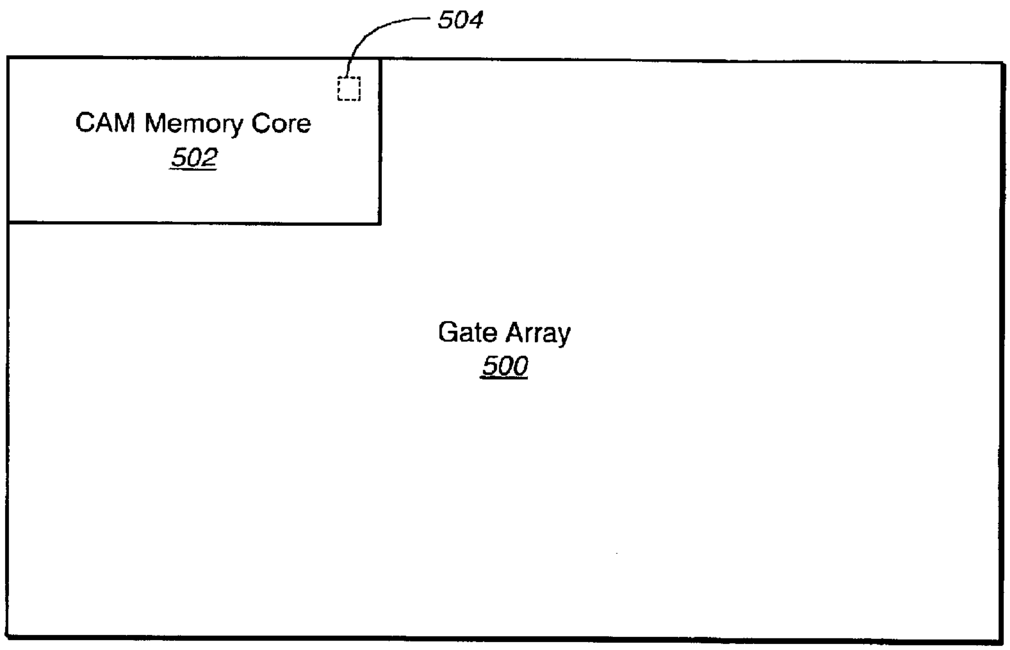
FIG._ 5A
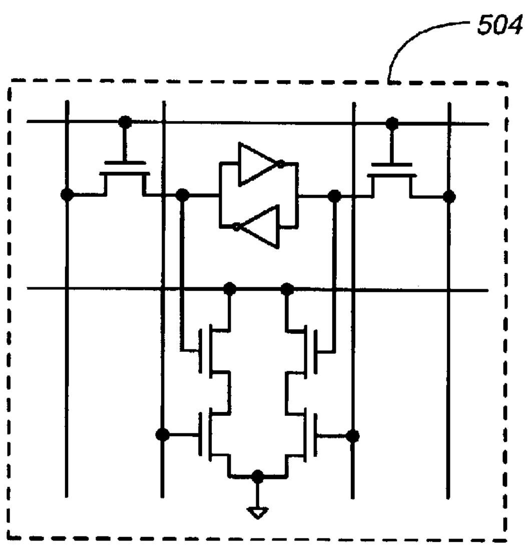
FIG._ 5B

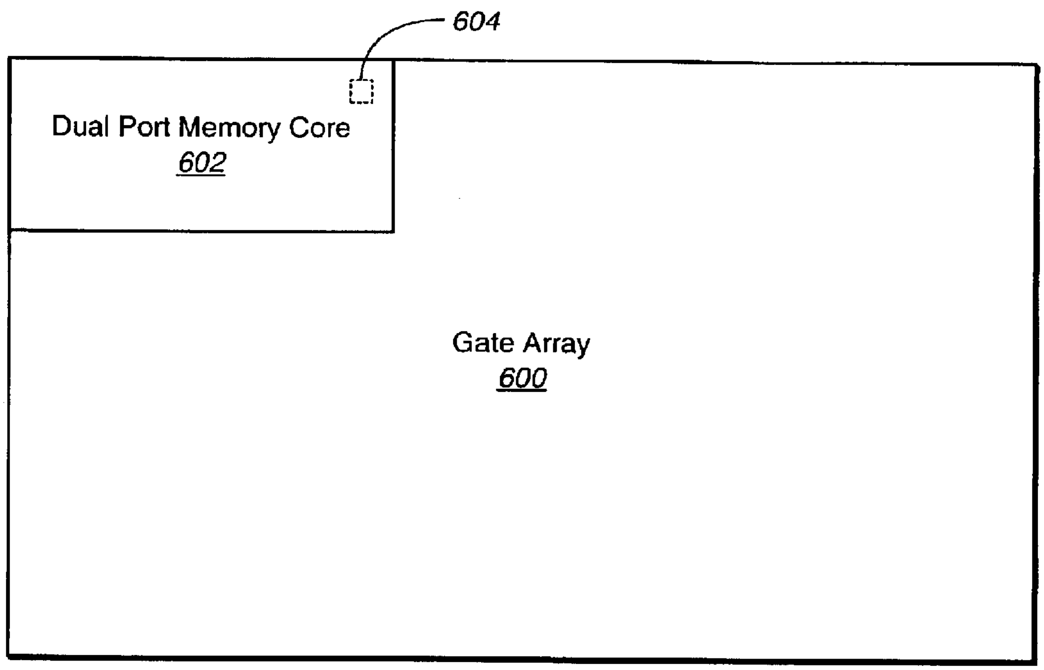
FIG._ 6A
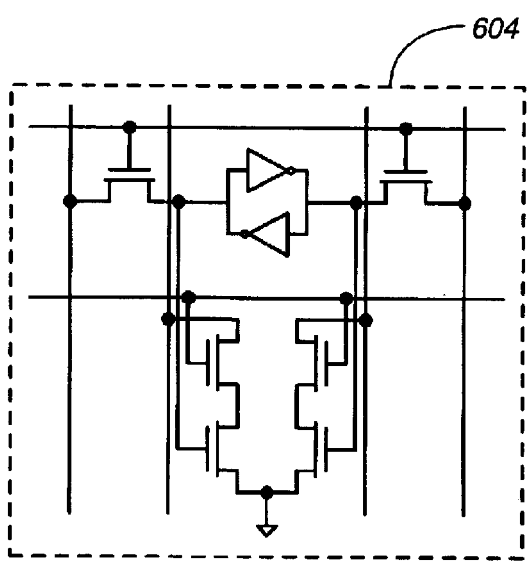
FIG._ 6B

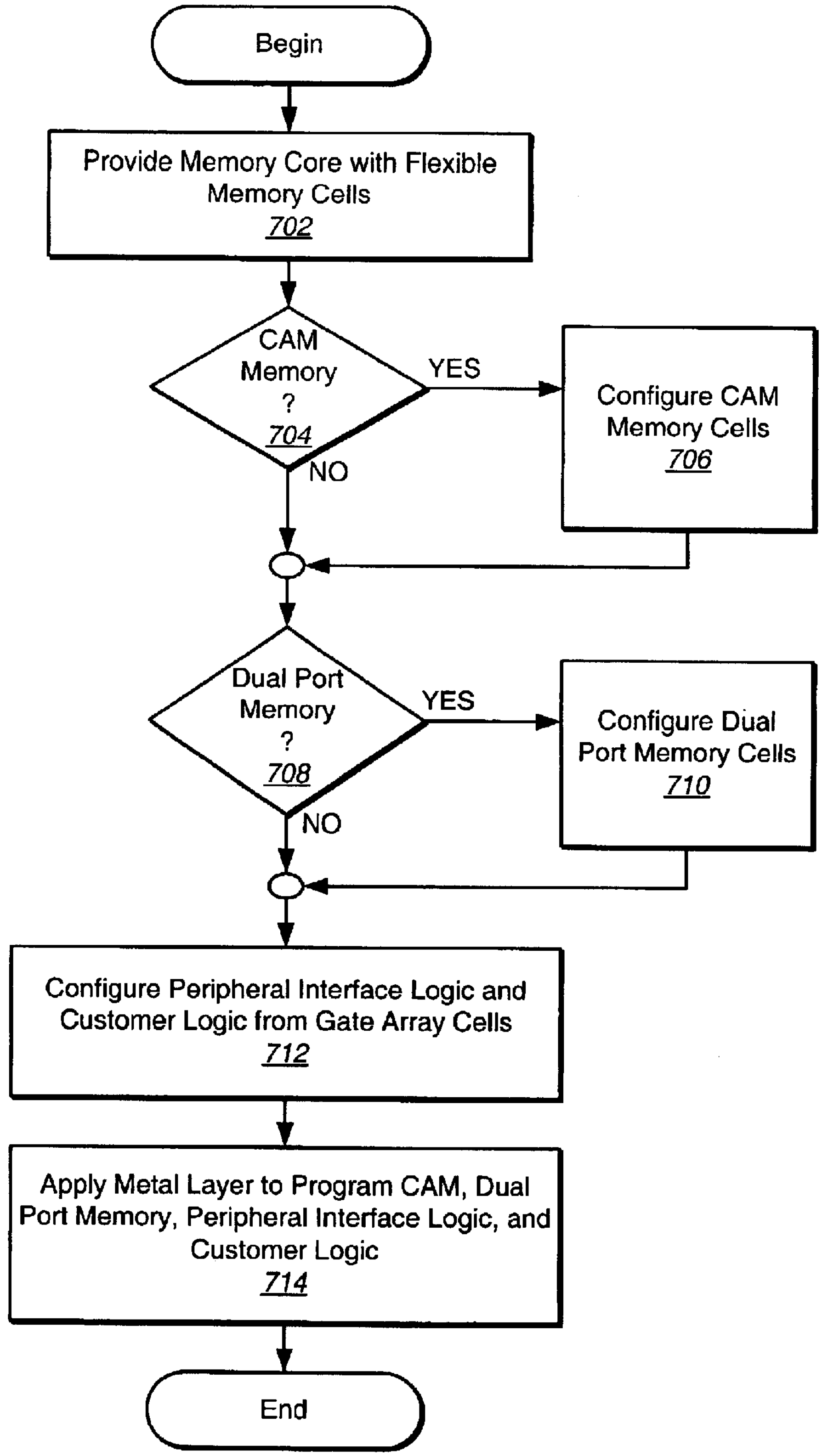
FIG._7

RE-CONFIGURABLE CONTENT ADDRESSABLE/DUAL PORT MEMORY

BACKGROUND OF THE INVENTION

1. Technical Field

The present invention is directed generally toward memory architecture and, more particularly, toward a method and apparatus for providing a re-configurable content addressable/dual port memory.

2. Description of the Related Art

Content addressable memory (CAM), also known as "associative storage," is a memory in which each bit position can be compared. In regular dynamic read only memory (DRAM) and static RAM (SRAM) chips, the contents are addressed by bit location and then transferred to the arithmetic logic unit (ALU) in the CPU for comparison. In CAM chips, the content is compared in each bit cell, allowing for very fast table lookups. Since the entire chip is compared, the data content can often be randomly stored without regard to an addressing scheme which would otherwise be required. However, CAM chips are considerably smaller in storage capacity than regular memory chips.

When designing an application-specific integrated circuit (ASIC) product, such as a metal programmable device, anticipating for a potential need for CAM is difficult. Existing solutions include embedding pre-diffused CAM blocks into the metal programmable device and, alternatively, building CAM memory entirely out of gate array elements in the metal programmable device.

Pre-diffused blocks of CAM take up space on the metal programmable chip. Since CAMs are not always used, there is little incentive to include CAM blocks on metal programmable products. On the other hand, building even a small CAM entirely out of gate array elements takes up a tremendous amount of area, because the storage element is so large. The performance of gate array CAM is also lower than that of a CAM built from an optimized core cell.

Therefore, it would be advantageous to provide a re-configurable content addressable memory.

SUMMARY OF THE INVENTION

The present invention provides a re-configurable core cell that can be used as either a content addressable memory cell or a dual-ported static read only memory cell. The re-configurable core cells are pre-diffused on the chip. The core cells may then be configured as CAM or SRAM with a metal layer. The peripheral logic of the CAM or SRAM may be built from gate array devices.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

FIG. 1 is a diagram of a re-configurable memory core cell in accordance with a preferred embodiment of the present invention;

FIG. 2 is a diagram of a content addressable memory cell in accordance with a preferred embodiment of the present invention;

FIG. 3 is a diagram of a static random access memory cell in accordance with a preferred embodiment of the present invention;

FIGS. 4A and 4B depict a metal programmable device in accordance with a preferred embodiment of the present invention;

FIGS. 5A and 5B depict a metal programmable device with a configured CAM core in accordance with a preferred embodiment of the present invention;

FIGS. 6A and 6B depict a metal programmable device with a configured SRAM core in accordance with a preferred embodiment of the present invention; and FIG. 7 is a flowchart illustrating a flowchart for providing an application specific circuit from a metal programmable device with re-configurable memory in accordance with a preferred embodiment of the present invention.

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

With reference now to the figures and in particular with reference to FIG. 1, a diagram of a re-configurable memory core cell is depicted in accordance with a preferred embodiment of the present invention. Re-configurable core cell 100 includes transistors 102, 104, 106, 108, 110, and 112, as well as inverters 122, 124. The re-configurable core cell may also include word lines, bit lines, and other conductors pre-diffused in the cell. For example, the drains of transistors 108, 112 may be pre-diffused to connect to ground.

With reference now to FIG. 2, a diagram of a content addressable memory cell is depicted in accordance with a preferred embodiment of the present invention. CAM cell 200 includes the same elements as the re-configurable core cell of FIG. 1; however, the elements are configured with a metal layer. Metal lines 202, 204, 206, 208, 210, and 212 connect the core cell elements to form a CAM core cell. This CAM cell includes word line, hit line, bit line pair (BL, BLN), and hit bit line pair (HBL, HBLN).

Turning now to FIG. 3, a diagram of a static random access memory cell is depicted in accordance with a preferred embodiment of the present invention. SRAM cell 300 includes the same elements as the re-configurable core cell of FIG. 1; however, the elements are configured with a metal layer. Metal lines 302, 304, 306, 308, 310, and 312 connect the core cell elements to form an SRAM core cell. This SRAM cell includes read word line, write word line, read bit line pair (RBL, RBLN), and write bit line pair (WBL, WBLN).

With reference to FIGS. 4A and 4B, a metal programmable device is shown in accordance with a preferred embodiment of the present invention. The metal programmable device includes gate array 400 with memory circuit 402 pre-diffused in the metal programmable device. Memory circuit 402, along with the rest of the device, does not have a metal layer. In this state, the metal programmable device is not yet programmed with customer logic.

Therefore, each cell in memory core 402 is a re-configurable memory cell 404, as shown as in FIG. 1. Peripheral interface logic may also be programmed in gate array 400 using the metal layer.

Turning now to FIGS. 5A and 5B, a metal programmable device with a configured CAM core is shown in accordance with a preferred embodiment of the present invention. The metal programmable device includes gate array 500 with memory circuit 502 pre-diffused in the metal programmable device. Memory circuit 502 is programmed using a metal layer. In this example, the memory cells are configured as CAM cells. Therefore, each cell in memory core 502 is a content addressable memory cell 504, as shown in FIG. 2. Peripheral interface logic may also be programmed in gate array 500 using the metal layer.

Next, with reference to FIGS. 6A and 6B, a metal programmable device with a configured SRAM core is shown in accordance with a preferred embodiment of the present invention. The metal programmable device includes gate array 600 with memory circuit 602 pre-diffused in the metal programmable device. Memory circuit 602 is programmed using a metal layer. In this example, the memory cells are configured as SRAM cells. Therefore, each cell in memory core 602 is a content addressable memory cell 604, as shown in FIG. 3. Peripheral interface logic may also be programmed in gate array 600 using the metal layer.

In the examples shown in FIGS. 5A, 5B, 6A, and 6B, the memory core is programmed as either content addressable memory or static random access memory. However, the memory core may be programmed as a combination of CAM and SRAM using the metal layer. Peripheral interface logic may also be programmed in the gate array to access the combination of memory types.

With reference now to FIG. 7, a flowchart is shown illustrating a flowchart for providing an application specific circuit from a metal programmable device with re-configurable memory in accordance with a preferred embodiment of the present invention. The process begins and provides a memory core with flexible memory cells (step 702). A determination is made as to whether content addressable memory is to be configured on the device (step 704). If CAM is to be configured, the process configures CAM cells (step 706) and a determination is made as to whether dual port memory is to be configured (step 708). If CAM is not to be configured in step 704, the process continues directly to step 708 to determine whether dual port memory is to be configured.

If dual port memory is to be configured, the process configures dual port memory cells (step 710). Then, the process configures peripheral interface logic and customer logic from gate array cells (step 712). If dual port memory is not to be configured in step 708, the process continues directly to step 712 to configure peripheral interface logic and customer logic. Next, the process applies a metal layer to program content addressable memory, dual port memory, peripheral interface logic, and customer logic (step 714). Thereafter, the process ends.

Thus, the present invention solves the disadvantages of the prior art by providing a re-configurable memory architecture. Metal programmable devices may include this re-configurable memory as a pre-diffused memory core. As such, the dual-purpose memory architecture may provide CAM capabilities without wasting chip area if CAM is not used. Some or all of the memory core can also be used as dual-port SRAM, which is also flexible.

What is claimed is:

1. A method for providing an application-specific device, comprising:

providing a gate array; and providing a re-configurable memory core, wherein the re-configurable memory core includes re-configurable memory cells capable of being programmed as one of content addressable memory and dual-port static random access memory with a metal layer, wherein programming with the metal layer includes at least one of:

applying a first metal layer to program the re-configurable memory cells to be a content addressable memory; and applying a second metal layer to program the re-configurable memory cells to be a dual-port static random access memory; and wherein the second metal layer is different from the first metal layer.

2. The method of claim 1, wherein the re-configurable memory core is a pre-diffused re-configurable memory core.

3. The method of claim 1, further comprising:

configuring a peripheral interface logic in the gate array, wherein the peripheral logic interfaces with the content addressable memory and wherein the step of applying a first metal layer includes programming the peripheral interface logic with the first metal layer.

4. The method of claim 1, further comprising:

configuring application-specific logic in the gate array, wherein the step of applying a first metal layer includes programming the application-specific logic with the first metal layer.

5. The method of claim 1, further comprising:

configuring a peripheral interface logic in the gate array, wherein the peripheral logic interfaces with the static random access memory and wherein the step of applying a second metal layer includes programming the peripheral interface logic with the second metal layer.

6. The method of claim 1, further comprising:

configuring application-specific logic in the gate array, wherein the step of applying a second metal layer includes programming the application-specific logic with the second metal layer.

7. The method of claim 1, wherein the static random access memory is a dual-port memory.

8. A metal programmable device, comprising:

a gate array;

a re-configurable memory core, wherein the re-configurable memory core includes re-configurable memory cells capable of being programmed as one of a content addressable memory and a static random access memory through application of a metal layer; and a metal layer applied to, and connecting the gate array and the re-configurable memory core, wherein if the metal layer is configured in a first manner to be a first metal layer, application of the first metal layer to the gate array and the re-configurable memory core programs the re-configurable memory core to be a content addressable memory, and wherein if the metal layer is configured in a second manner to be a second metal layer, application of the second metal layer to the gate array and the re-configurable memory core programs the re-configurable memory core to be a static random access memory, wherein the first metal layer and the second metal layer have different configurations.

9. The metal programmable device of claim 8, wherein the re-configurable memory core is a pre-diffused re-configurable memory core.

10. The metal programmable device of claim 8, wherein the first metal layer programs a peripheral interface logic in the gate array, wherein the peripheral logic interfaces with the content addressable memory.

11. The metal programmable device of claim 8, wherein the first metal layer programs application-specific logic in the gate array.

12. The metal programming device of claim 8, wherein each cell of the content addressable memory includes a word line, a hit line, a bit line pair, and a hit bit line pair.

13. The metal programmable device of claim 8, wherein the second metal layer programs a peripheral interface logic in the gate array, wherein the peripheral logic interfaces with the static random access memory.

14. The metal programmable device of claim 8, wherein the second metal layer programs application-specific logic in the gate array.

15. The metal programmable device of claim 8, wherein the static random access memory is a dual-port static random access memory.

16. The metal programming device of claim 15, wherein each cell of the dual-port static random access memory includes a read word line, a write word line, a read bit line pair, and a write bit line pair.

17. The method of claim 1, wherein the first metal layer and second metal layer connect elements of the re-configurable memory cells to different metal lines for each of the first configuration and second configuration.

18. The metal programmable device of claim 8, wherein the first metal layer and second metal layer connect elements of the re-configurable memory cells to different metal lines for each of the first configuration and second configuration.

* * * * *